United States Patent
Hartman et al.

(10) Patent No.: US 6,902,069 B2
(45) Date of Patent: Jun. 7, 2005

(54) SYSTEM AND METHOD FOR RACK CABLE MANAGEMENT

(75) Inventors: Corey D. Hartman, Round Rock, TX (US); Wayne E. McKinnon, Georgetown, TX (US); Robert J. Neville, Jr., Round Rock, TX (US); Tyler L. Burgener, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 8 days.

(21) Appl. No.: 10/278,263

(22) Filed: Oct. 23, 2002

(65) Prior Publication Data

US 2004/0079711 A1 Apr. 29, 2004

(51) Int. Cl.⁷ .................................................. A47F 7/00
(52) U.S. Cl. ........................................ 211/26; 361/826
(58) Field of Search ..................... 211/26, 192, 80–84, 211/126.15, 126.6, 120.1, 132.1, 168; 312/223.6, 333, 334.44, 334.47; 361/826, 829, 727, 725

(56) References Cited

U.S. PATENT DOCUMENTS

| | | | | |
|---|---|---|---|---|
| 3,133,768 A | | 5/1964 | Klakovich et al. ............ 308/3.6 |
| 3,665,943 A | * | 5/1972 | Lampman et al. ........... 134/200 |
| 3,680,711 A | | 8/1972 | Brucker ..................... 211/105.3 |
| 3,697,034 A | | 10/1972 | Shell ........................... 248/243 |
| 3,710,199 A | * | 1/1973 | Cignoni, Jr. ................. 361/827 |
| 4,184,726 A | | 1/1980 | Cox ............................ 312/320 |
| 4,406,374 A | | 9/1983 | Yedor ......................... 211/192 |
| 4,456,128 A | * | 6/1984 | Warshaw ...................... 211/11 |
| 4,614,383 A | * | 9/1986 | Polley et al. ................ 312/273 |
| 4,731,029 A | | 3/1988 | Lerner et al. .................. 439/4 |

(Continued)

OTHER PUBLICATIONS

U.S. Pending Appl. No. 10/675,102 entitled "Cable Management Flip Tray Assembly" by Daniel G. Lee, et al.; Dell Products L.P. (DC–04824), filed Sep. 30, 2003.

U.S. Pending Appl. No. 10/393,620 entitled "Tool–less Cable Management Attachment Bracket and Method of Use" by Tiffany J. Williams; Dell Products L.P. (DC–03692), filed Mar. 21, 2003.

U.S. Pending Appl. No. 10/206,302 entitled "System and Method for Utilizing Non–Dedicated Rack Space" by Terrence Q.E. Rafferty et al.; Dell Products L.P. (DC–03171), filed Jul. 26, 2002.

U.S. Pending Appl. No. 09/518,841 entitled "Rack Mount Slide System Enabling Front Top and Rear Access to a Rack Mounted Device" by Alfred Rafi Baddour, et al.; Dell Products L.P. (DC–02172), filed Jun. 24, 1997.

Figures filed in U.S. Pending Appl. No. 09/518,841 entitled "Rack Mount Slide System Enabling Front, Top and Rear Access to a Rack Mounted Device" by Baddour et al., assigned to Dell Products L..P. (DC–02172), filed Mar. 3, 2000.

Figures for U.S. Pending Appl. No. 10/675,102 entitled "Cable Management Flip Tray Assembly" by Daniel G. Lee, et al.; Dell Products L.P. (DC–04824), filed Sep. 30, 2003.

Figures for U.S. Pending Appl. No. 10/206,302 entitled "System and Method for Utilizing Non–Dedicated Rack Space" by Terrence Q.E. Rafferty et al.; Dell Products L.P. (DC–03171), filed Jul. 26, 2002.

(Continued)

*Primary Examiner*—Jennifer E. Novosad
(74) *Attorney, Agent, or Firm*—Baker Botts L.L.P.

(57) ABSTRACT

A cable management assembly includes a first arm assembly pivotally connected with a second arm assembly. Each arm assembly includes a slide lock which may tool-lessly couple to a slide lock receptacle attached to a rack slide chassis member or a rack slide stationary member, allowing the cable management assembly to be chassis independent and reversible. The arm assemblies include basket trays with movable covers that facilitate the storage of cabling.

19 Claims, 6 Drawing Sheets

U.S. PATENT DOCUMENTS

| | | | | |
|---|---|---|---|---|
| 4,830,200 | A | * | 5/1989 | Zambano et al. ........ 211/133.5 |
| 4,931,907 | A | | 6/1990 | Robinson et al. ........... 361/391 |
| 5,018,052 | A | | 5/1991 | Ammon et al. ............. 361/428 |
| 5,216,579 | A | | 6/1993 | Basara et al. ............... 361/383 |
| 5,417,490 | A | * | 5/1995 | Hobbs et al. .......... 312/334.47 |
| 5,460,441 | A | | 10/1995 | Hastings et al. ............ 312/298 |
| 5,505,533 | A | | 4/1996 | Kammersqard et al. .... 312/236 |
| 5,546,277 | A | * | 8/1996 | Zandbergen ................ 361/726 |
| 5,571,256 | A | | 11/1996 | Good et al. .................... 211/26 |
| 5,579,924 | A | | 12/1996 | Sands et al. ................... 211/26 |
| 5,655,738 | A | | 8/1997 | Ragsdale et al. .......... 248/68.1 |
| 5,684,671 | A | | 11/1997 | Hobbs et al. ............... 361/683 |
| 5,759,502 | A | * | 6/1998 | Spencer et al. ............. 422/300 |
| 5,791,498 | A | | 8/1998 | Mills ........................... 211/26 |
| 5,833,337 | A | | 11/1998 | Kofstad ................... 312/334.5 |
| 5,850,925 | A | | 12/1998 | Gandre ........................ 211/26 |
| 5,890,602 | A | | 4/1999 | Schmitt ........................ 211/26 |
| 5,893,539 | A | * | 4/1999 | Tran et al. ................. 248/68.1 |
| 5,893,593 | A | | 4/1999 | Dowling .................. 292/336.3 |
| 5,921,402 | A | | 7/1999 | Magenheimer .............. 211/26 |
| 5,941,621 | A | | 8/1999 | Boulay et al. ........... 312/334.4 |
| 6,011,701 | A | | 1/2000 | Kopp et al. ................. 361/818 |
| 6,021,047 | A | | 2/2000 | Lopez et al. ................ 361/727 |
| 6,021,909 | A | | 2/2000 | Tang et al. .................. 211/183 |
| 6,070,742 | A | | 6/2000 | McAnally et al. ............ 211/26 |
| 6,070,841 | A | | 6/2000 | Robinson ............... 248/220.43 |
| 6,070,957 | A | | 6/2000 | Zachrai ................... 312/334.4 |
| 6,071,742 | A | | 6/2000 | Tracy et al. ............. 435/320.1 |
| 6,095,345 | A | | 8/2000 | Gibbons ....................... 211/26 |
| 6,142,590 | A | | 11/2000 | Harwell ................... 312/223.1 |
| 6,181,549 | B1 | | 1/2001 | Mills et al. ................. 361/683 |
| 6,185,092 | B1 | | 2/2001 | Landrum et al. ........... 361/683 |
| 6,185,098 | B1 | | 2/2001 | Benavides .................. 361/695 |
| 6,223,908 | B1 | | 5/2001 | Kurtsman .................... 211/26 |
| 6,230,903 | B1 | | 5/2001 | Abbott ........................ 211/26 |
| 6,257,683 | B1 | * | 7/2001 | Yang ........................... 312/333 |
| 6,273,534 | B1 | | 8/2001 | Bueley et al. ............ 312/334.8 |
| 6,297,962 | B1 | | 10/2001 | Johnson et al. ............. 361/726 |
| 6,305,556 | B1 | | 10/2001 | Mayer ......................... 211/26 |
| 6,326,547 | B1 | | 12/2001 | Saxby et al. ................. 174/69 |
| 6,327,139 | B1 | * | 12/2001 | Champion et al. .......... 361/608 |
| 6,365,834 | B1 | | 4/2002 | Larsen et al. ............... 174/100 |
| 6,373,721 | B2 | | 4/2002 | Lecinski et al. ............ 361/826 |
| 6,398,041 | B1 | | 6/2002 | Abbott ........................ 211/26 |
| 6,398,149 | B1 | | 6/2002 | Hines et al. ................. 242/399 |
| 6,407,933 | B1 | | 6/2002 | Bolognia et al. ........... 361/826 |
| 6,422,399 | B1 | | 7/2002 | Castillo et al. ............... 211/26 |
| 6,429,376 | B1 | | 8/2002 | Mendoza ..................... 174/97 |
| 6,431,668 | B1 | | 8/2002 | Reddicliffe .............. 312/334.5 |
| 6,435,354 | B1 | | 8/2002 | Gray et al. ................... 211/26 |
| 6,442,030 | B1 | * | 8/2002 | Mammoser et al. ........ 361/727 |
| 6,450,600 | B1 | * | 9/2002 | Chen et al. ............ 312/334.46 |
| 6,523,918 | B1 | * | 2/2003 | Baiza ...................... 312/265.1 |
| 6,547,289 | B1 | * | 4/2003 | Greenheck et al. ......... 292/126 |
| 6,554,142 | B2 | | 4/2003 | Gray ........................... 211/26 |
| 6,554,379 | B2 | * | 4/2003 | Devine ....................... 312/333 |
| 6,600,665 | B2 | * | 7/2003 | Lauchner .................... 361/826 |
| 6,637,704 | B2 | * | 10/2003 | Jette ............................ 248/49 |
| 6,648,390 | B1 | * | 11/2003 | Yang ........................... 294/161 |
| 6,672,692 | B2 | * | 1/2004 | Weng .......................... 312/333 |
| 6,685,033 | B1 | * | 2/2004 | Baddour et al. ............... 211/26 |
| 6,702,124 | B2 | * | 3/2004 | Lauchner et al. ........... 211/126 |
| 2001/0031124 | A1 | * | 10/2001 | McGarth et al. ............ 385/134 |
| 2003/0026084 | A1 | | 2/2003 | Lauchner .................... 361/826 |
| 2003/0111436 | A1 | * | 6/2003 | Basinger et al. ............ 211/183 |
| 2003/0123832 | A1 | | 7/2003 | Adapathya et al. ......... 385/135 |
| 2003/0222034 | A1 | * | 12/2003 | Champion et al. ............ 211/26 |

OTHER PUBLICATIONS

Figures for U.S. Pending Appl. No. 10/393,620 entitled "Tool–less Cable Management Attachment Bracket and Method of Use" by Tiffany J. Williams; Dell Products L.P. (DC–03692), filed Mar. 21, 2003.

U.S. Pending Appl. No. 09/518,841 entitled *"Rack Mount Slide System Enabling Front, Top and Rear Access to a Rack Mounted Device"* by Baddour et al., assigned to Dell Products L..P. (DC–02172), filed Mar. 3, 2000.

U.S. Pending Appl. No. 08/881,289 entitled *"Chassis Retaining System for an Electronics Rack"* by Mills et al., assigned to Dell Products USA L.P. (Client No. DC–01275), filed Jun. 24, 1997.

U.S. Pending Appl. No. 09/470,280 entitled *"Connector Arrangement and Connecting Method for Cable Management Arms"*, assigned to Dell USA L.P. (Client No. DC–02095), filed Dec. 22, 1999.

Technical Data for HP Part No. J1478A LH NetServer Cable Management Arm for non–HP racks by Hewlett Packard Company located at internet site http://www.hp.com/rack-solutions/114tab1.html, printed Jan. 23, 2001.

Maintenance and Service Guide *"Illustrated Parts Catalog Chapter 1—Illustrating the family of Compaq Rack–Mountable ProLiant 1500R Servers,"* 3 pages, no date.

Compaq Rack Products Reference Guide *"Installing Components in the Rack,"* 5 pages, no date.

Compaq AlphaServer ES40 Rackmount System Installation Guide *"Installing the Cable Management Arm,"* pp 18–21, no date.

Compaq ProLiant ML350 Tower–to–Rack Conversion Guide 2 pages, no date.

Netra t1 and Netra st D130 Rackmount Installation Chapter 2 pp 9–14, Jun. 2000.

Compaq ProLiant DL360 Ultra–Dense Server Deployment in Compaq Racks *"4.6.3.2. Sliding–Rail Cable Management"* pp 89–90, no date.

IBM Magstar MP 3570 Tape Subsystem OPerator Guide C–Series Models *"Installing the Rack–Mounted 3570"* pp 86–98, no date.

Cabling Reference for the HP NetServer LXr Pro, Chapter 4, pp 46–48, no date.

J1478A—HP Cable Management Arm for LHx000r by Hewlett Packard 1 page, Feb. 24, 2000.

IBM Magstar MP 3570 Tape Subsystem Operator Guide C–Series Models Attaching SCSI and Power Cables to Model C21 (Single Drive with Single Host) 1 page, no date.

* cited by examiner

SYSTEM AND METHOD FOR RACK CABLE MANAGEMENT

TECHNICAL FIELD

The present disclosure relates in general to computer systems and more particularly to a system and method for rack cable management.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often stored in racks and require a significant amount of cabling. Cable management assemblies (CMA) are used within computer rack systems to manage cabling that interfaces components stored within a rack. A number of different CMA options are available but suffer from a number of drawbacks. One common drawback is that most CMAs involve a complex assembly that is difficult to install. Often, CMAs include loose hardware such as nuts, bolts or other fasteners to attach the CMA to the rack enclosure. Loose fasteners make CMAs difficult to install or remove from a rack, often making these CMAs difficult or unlikely to be fully utilized.

Another common problem experienced with CMAs is a lack of adequate strength and stability. Many CMAs suffer from a lack of structural integrity, resulting in sagging. Such sagging often interferes with other components mounted within the rack and impede system access for installation, maintenance or repair service to components stored within a rack. Cables and CMA contents also can sag and interfere with other rack components, possibly damaging critical cables or rack components. Additionally, CMAs typically store a significant amount of cabling, particularly in dense rack configurations. Such a mass of cables often leads to visual clutter which may be perceived by customers to impair the overall appeal of the system. Another problem is that CMAs often attach directly to an information handling system component. This often leads to problems with components and CMAs that do not have compatible connection interfaces.

SUMMARY

Therefore a need has arisen for a cable management assembly that is easy to install. A further need has arisen for a CMA assembly which has adequate structural integrity as well as for a CMA that facilitates an organized visual appearance.

In accordance with teachings of the present disclosure, a system and method are described for an improved cable management system and method that significantly reduces the problems associated with prior CMA systems.

In one aspect, a cable management assembly is disclosed that includes a first arm assembly pivotally connected to a second arm assembly. Each arm assembly includes both a basket tray and a movable cover formed to allow cabling to be run within the basket tray and secured within the basket tray by the movable cover. More specifically, the movable cover may be formed from a wire frame-type construction.

In another aspect of the present disclosure, a cable management assembly is described that includes a first arm assembly pivotally connected with a second arm assembly. The first arm assembly includes a first slide lock that is formed to connect with a slide lock receptacle attached to a rack slide chassis member. The second arm assembly includes a slide lock formed to connect with a slide lock receptacle attached to a rack slide stationary member. More specifically, the first slide lock may tool-lessly connect and disconnect with the first slide lock receptacle and the second slide lock may be formed to tool-lessly connect and disconnect with the second slide lock receptacle. The first and second slide locks are substantially identical and reversible. Accordingly, each is compatible with the first or second slide lock receptacle. Thus the CMA may be rotated and installed on either side of a rack. Additionally, the components of the cable management assembly may include die cast components.

The present disclosure involves a number of important technical advantages. One important technical advantage is the inclusion of arm assemblies having basket trays and moveable cover. The basket trays and moveable covers also act to provide a visually organized system for retaining component cabling. The enclosed basket tray ensures cables do not sag outside of the proper rack space and interfere with other rack components, which could damage the cables.

The die cast components provide added structural support to prevent sagging by the CMA or cabling stored within the CMA to interfere with rack components or other CMAs stored within a rack. Another technical advantage is providing arm assemblies with slide locks that couple with slide lock receptacles disposed both on a rack slide chassis member and a rack slide stationary member. This allows for the attachment of the CMA to the rack to be both uniform and chassis independent. Additional advantages are described in the FIGURES, Description, and claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 7, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (UO) devices, such as a keyboard, a mouse, and a video display. The information handling system may also include one or more buses operable to transmit communications between the various hardware components. Information handling system components are often stored in racks and interconnected with multiple cables.

Figure 1:
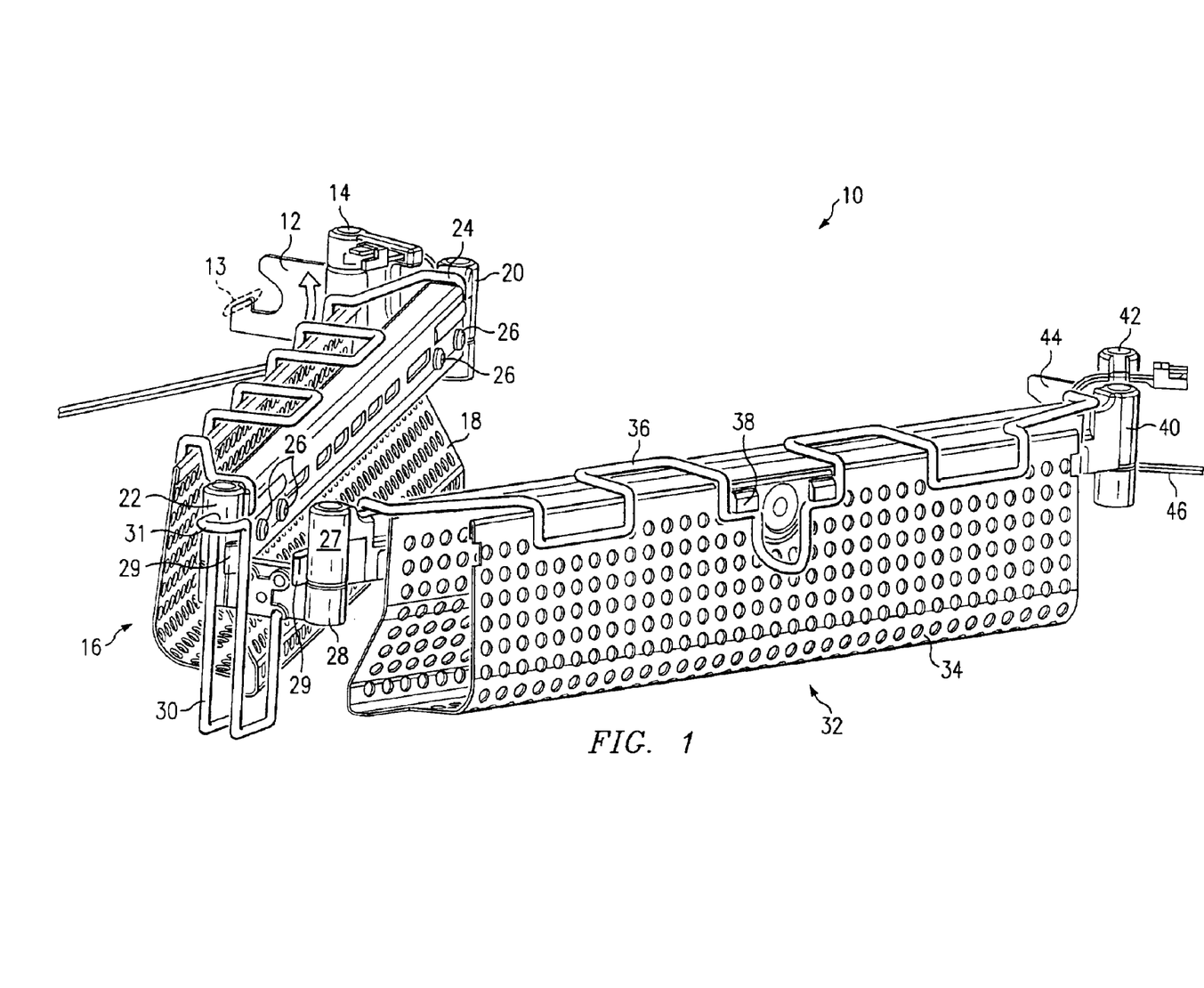
FIG. 1 shows an isometric view of a cable management assembly with a wire frame cover in a closed position according to teachings of the present disclosure.

Now referring to FIG. 1, an isometric view of a cable management assembly depicted generally at 10, is shown. Cable management assembly 10 includes a first arm assembly 16 and a second arm assembly 32. First arm assembly 16 and a second arm assembly 32 are both pivotally connected with end member 28.

Figure 3:
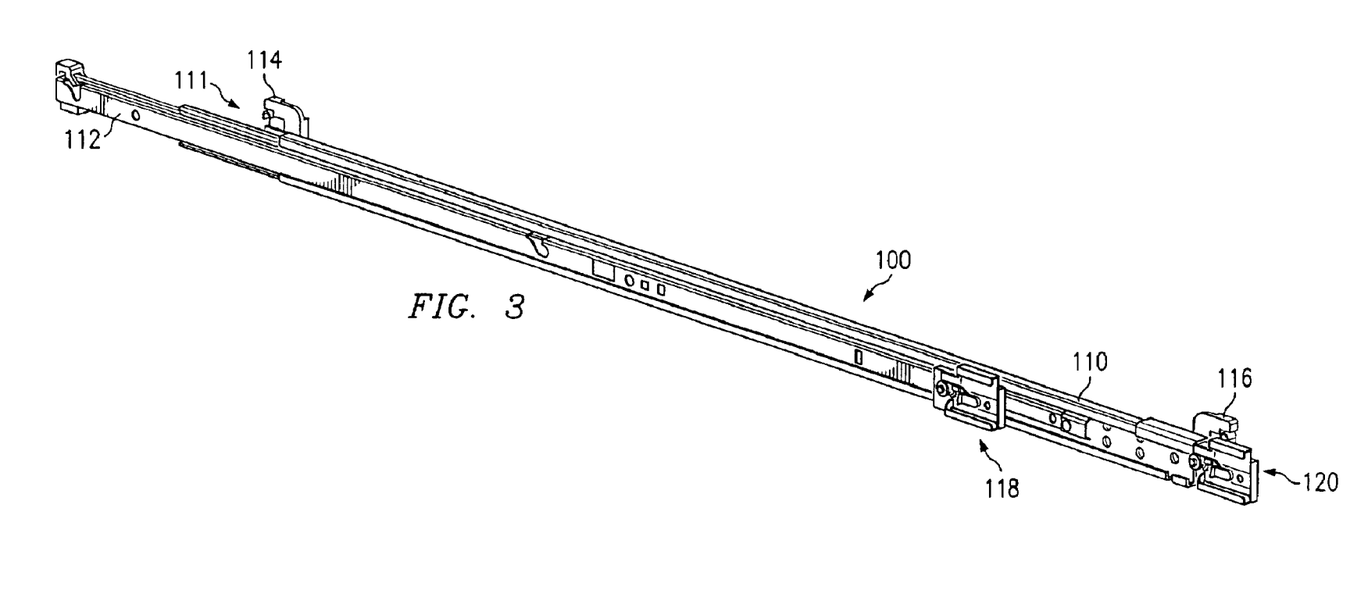
FIG. 3 shows a rack slide assembly.

In the present embodiment first arm assembly 16 includes first slide lock 12 which is formed to connect with a slide lock receptacle as shown in FIG. 3. First slide lock 12 includes locking nub portion 13. First slide lock 12 is pivotally connected or coupled with pivot arm 14. In the present embodiment pivot arm 14 includes both a slide lock connection post and a hinge arm connection post for pivotally connecting with first slide lock 12 and hinge arm 20, respectively. In the present embodiment the first slide lock post engages slide lock 12 in a downward fashion such that pivot arm 12 essentially rests on the portion of slide lock 12 formed to receive pivot arm 14. In an alternative embodiment, the post may comprise a separate part that may be inserted into portions of slide lock 12 and hinge arm 20 to facilitate a pivotal joint.

In the present embodiment, all of the pivotal connectors utilize a similar hinge-post feature. Moreover, the present disclosure contemplates any suitable pivotal connector such as a hinge connector.

Hinge arm 20 is pivotally connected with pivot arm 14. Hinge arm 20 is then attached to one end of basket tray 18. Hinge arm 22 is connected with the other end of basket tray 18. Hinge arms 20 and 22 are releasably secured to basket tray 18 using fasteners 26.

Figure 2:
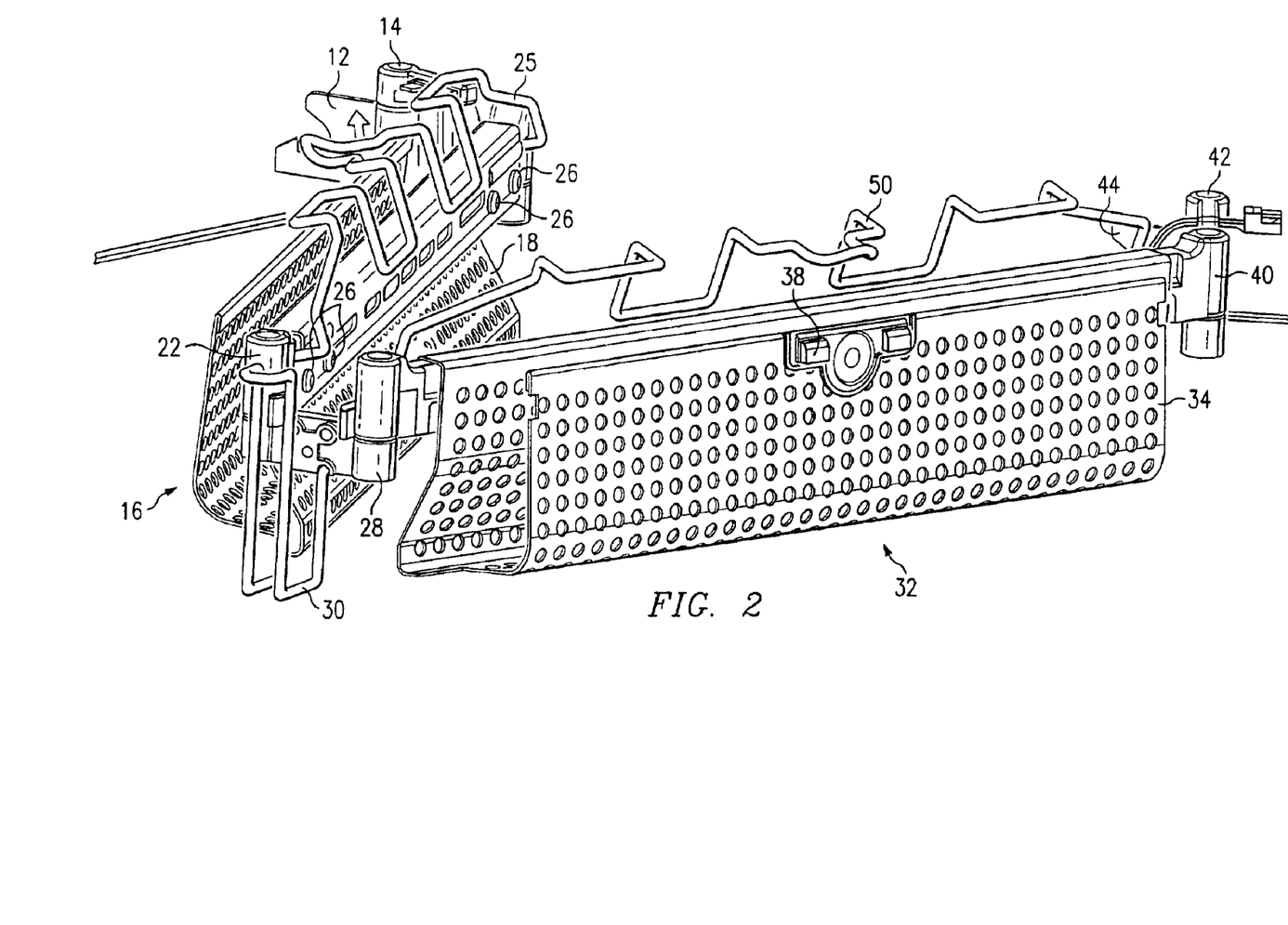
FIG. 2 shows the cable management assembly of FIG. 1 with a wire frame cover shown in an open position.

Wire frame cover 24 is shown in a closed position with respect to basket tray 18. Portions of wire frame cover 24 are engaged within grooves formed in hinge arms 20 and 22 that secure wire frame cover 24 with respect to basket tray 18 and also allow frame cover 24 to be moved between a closed position as shown and an open position as shown in FIG. 2.

In an alternative embodiment hinge arm 20, basket tray 18 and hinge arm 22 may be combined into a single component. However, the multiple component embodiment shown may advantageously be modified by adding a replacement basket tray (not expressly shown) that may have a different height, depth or width than basket tray 18. The advantage of replacing basket tray 18 with a replacement basket tray is that cable management assembly 10 may be selectively modified to increase or decrease the width of the cable management assembly to accommodate racks of varying widths and also be adapted to change the basket space available to route associated cabling. For instance, basket tray 18 may be sufficient to store cabling associated with a 2U component stored within a rack system, however, basket tray 18 may be to store cabling associated with a 7U component stored within a rack system. By allowing basket tray 18 to be selectively replaced with a larger basket tray cable management assembly 10 may be scaled to accommodate different cabling management needs.

Hinge arm 22 is pivotally connected with end member 28. End member 28 also includes tabs 29 formed thereon to limit the angle at which first arm assembly 16 may form with end member 28.

Figure 7:
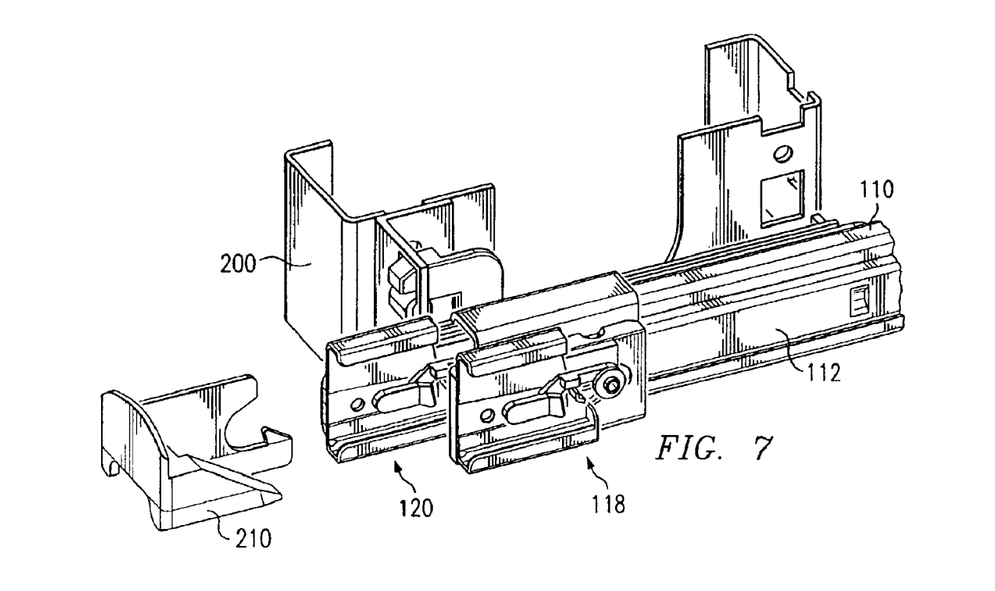
FIG. 7 shows an isometric view of a CMA stop member shown in relation to a rack slide assembly.

Tray hook 30 is a wire frame component formed to connect with a portion of end member 28. Tray hook 30 is preferably formed to retain cabling that is routed through basket tray 18 and basket tray 34. Tray hook 30 acts to retain cables and to prevent cables from sagging as cables bend and exit from basket tray 18 to enter basket tray 34. tray 30 also includes a catch feature 31 formed to interface with a CMA stop (as shown in FIG. 7) to allow cable management assembly to be selectively retained with respect to a CMA stop in the opposite side rail assembly.

Second arm assembly 32 is pivotally connected with end member 28. Second arm assembly 32 includes hinge arm 30, basket tray 34, and hinge arm 40. Hinge arms 30 and 40 are coupled to the respective ends of basket tray 34. Second arm assembly also includes wire frame cover 36. A portion of wire from cover 36 is disposed with a groove formed in hinge arms 30 and 40 allowing wire frame cover 36 to be selectively moved between a closed position as shown and an open position as shown in FIG. 2. Basket tray 34 includes latch 38 formed to allow the selective retention of wire frame cover 36 in a closed position with respect to basket tray 34. In an alternative embodiment, wire frame cover 36 may be any suitable cover formed to secure cabling within basket tray 34 and able to be moved between an open position to allow cabling to be placed within a basket tray and a closed position operable to retain cabling within a basket tray. Hinge arm 40 is pivotally connected with pivot arm 42 and pivot arm 42 is pivotally connected with second slide lock 44.

In the present embodiment basket trays 34 and 18 are formed from a perforated sheet metal material having a plurality of apertures or holes formed therein to allow for and facilitate increased airflow through the basket trays 34 and 18.

Also in the present embodiment pivot arms 14 and 42 include slots formed therein to accommodate a tie such as tie 46. Tie 46 may be used after cabling has been installed within cable management assembly 10 to selectively retain cabling that is either entering or exiting cable management assembly 10.

Now referring to FIG. 2, an isometric view of the cable management assembly of FIG. 1 is shown with wire frame cover 36 shown in open position 50. Open position 50 allows for cabling to be routed along (or removed from) cable management assembly 10 through basket trays 18 and 34.

Now referring to FIG. 3, a rack slide assembly, depicted generally at 100, is shown. Slide assembly 100 includes rack slide stationary member 110 with tool-less rack attachments 114 and 116 attached to the respective ends of rack slide stationary member 110. Rack attachments 114 and 116 allow stationary member 110 to tool-lessly attach to portions of a rack such as an EIA-310 compliant rack. In an alternative embodiment rack attachments 114 and 116 may utilize loose fasteners such as nuts and bolts or thumbscrews or other suitable fasteners to connect a rack slide stationary member 110 to a rack.

Slide assembly 100 also includes rack slide intermediate member 111 and rack slide chassis member 112. Rack slide intermediate member is slidably engaged with rack slide stationary member 110 and rack slide chassis member 12 is slidably engaged with rack slide intermediate member 111 such that rack slide chassis member 112 telescopes or extends with respect to rack slide stationary member 110. In alternative embodiments, slide assembly 100 may include additional intermediate members or stationary member 110 may directly engage chassis member 112.

In operation slide assembly arm 110 is secured within a rack. Rack slide chassis member 112 is slidably disposed with respect to rack slide stationary member 110 such that rack slide chassis member 112 may slide forward from the rack or may be positioned adjacent to rack slide stationary member 110 and fully into the interior of the rack. An information handling system component may be attached to slides 112, allowing the component to slide forward with respect to the rack or be housed entirely with the rack.

First slide lock receptacle 118 is attached to an end portion of rack slide chassis member 112. Second slide lock receptacle 120 is attached to the end portion of rack slide stationary member 110.

Figure 4:
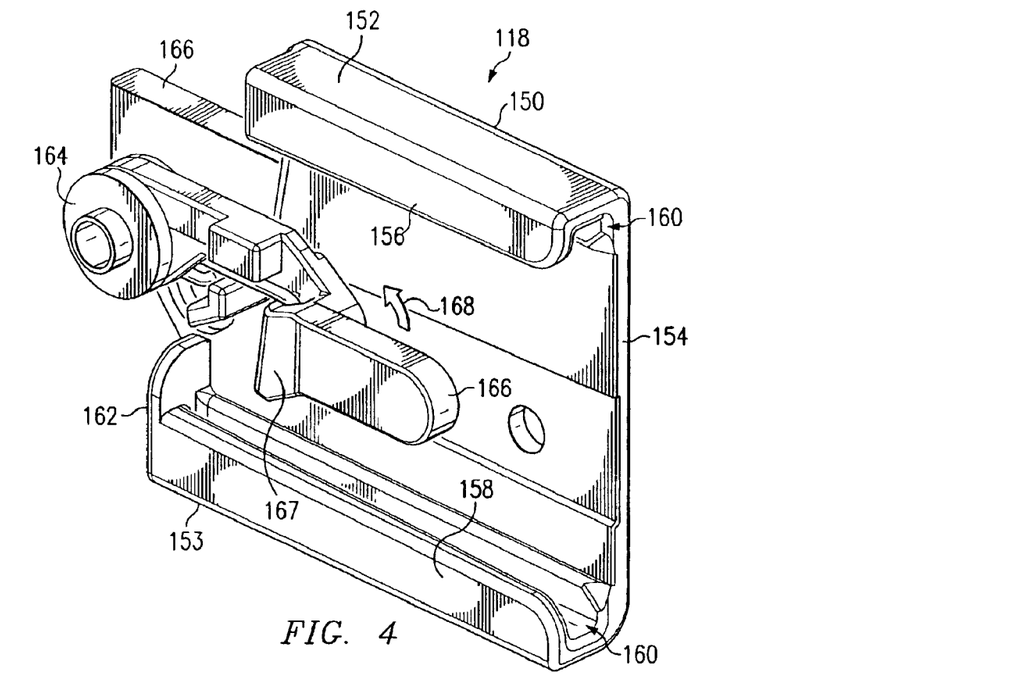
FIG. 4 shows a slide lock receptacle according to teachings of the present disclosure.

Now referring to FIG. 4, an isometric view of slide lock receptacle 118 is shown. Slide lock receptacle 118 includes receptacle body 150. Receptacle body is made up of receptacle backface 154, receptacle top 152 and receptacle bottom 153 formed on the respective top and bottom of receptacle backface 154. Receptacle 152 is extended downward to form top lip 156. Top lip 156, receptacle top 152 and receptacle backface 154 form groove 160 therein. Similarly, receptacle bottom 153 is disposed at the bottom of receptacle backface 154 and extends upward to form bottom lip 158. Bottom lip 158, receptacle bottom 153 and receptacle backface 154 also form groove 160 therein.

Receptacle body extends rearward to include latch mount surface 166. Latch mount surface includes spring biased latch assembly 164 which is connected with latch tab 166. Latch tab 166 cooperates with spring biased latch assembly 164 to allow latch tab 166 to move in the direction of arrow 168.

Figure 5:
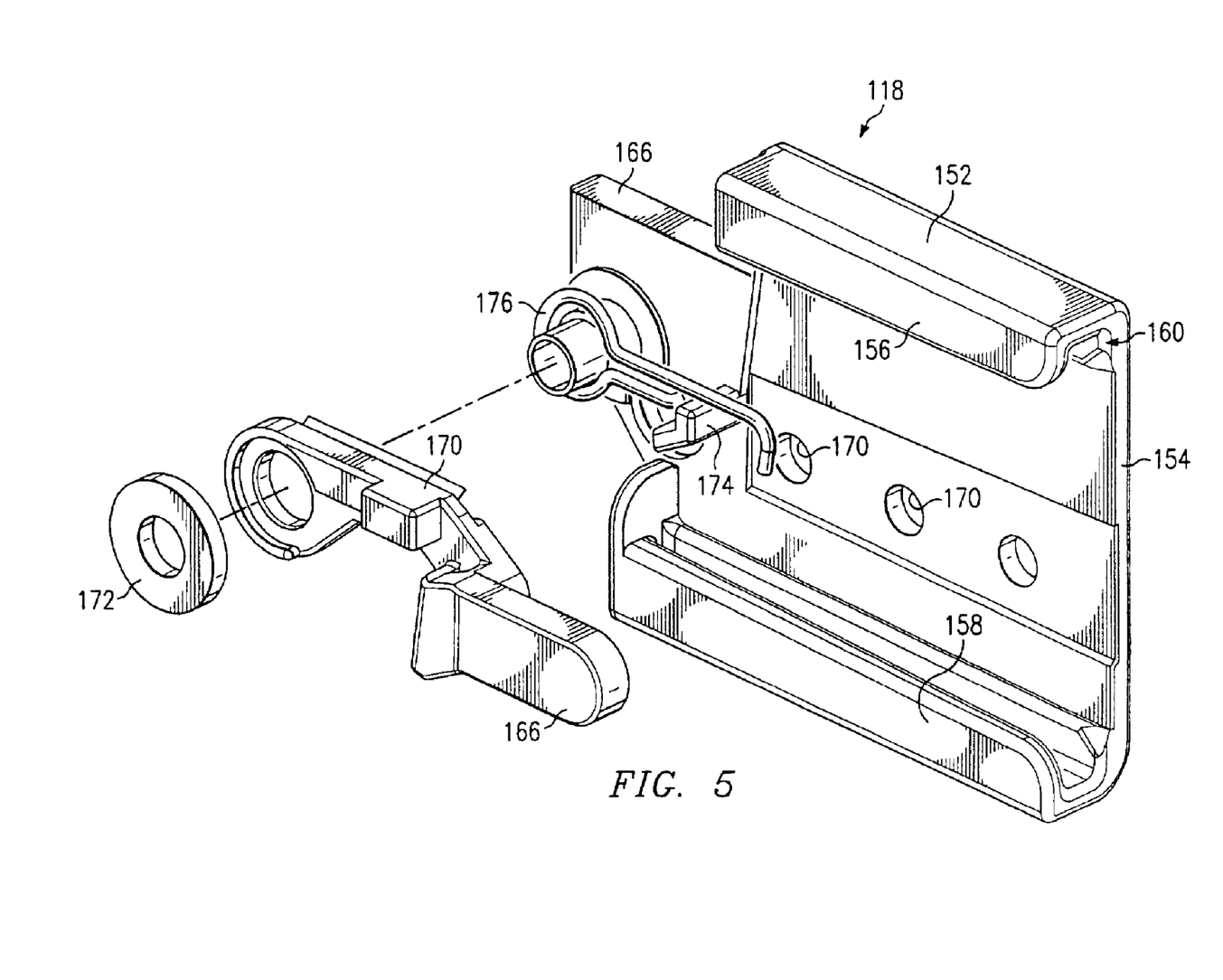
FIG. 5 shows an exploded view of the slide lock receptacle of FIG. 4.

Now referring to FIG. 5, an exploded view of slide lock receptacle 118 is shown. Receptacle backface 154 has a number of mounting holes 170 formed therein to allow slide lock receptacle 118 to be secured to a slide such as rack slide chassis member 112 or a rack slide stationary member such as rack slide stationary member 110. Spring biased latch assembly 164 includes spring arm 176 formed to cooperate and interface with latch arm 170. In addition, retainer 172 allows latch arm 170 to be retained with respect to spring arm 176. Latch stop 174 provides a barrier for the movement of latch arm 170 and spring arm 176.

In operation, a user may insert a slide lock within groove 160 and push it toward latch tab 166. In the present preferred embodiment, a slide lock such as first slide lock 12 is formed to interface with latch tab 166 and groove 160 such that as first slide lock 12 is pushed towards latch tab 166 while engaged within groove 160, latch tab 166 moves in the direction of arrow 168 until a locking nub 13 of slide lock 12 advances past latch tab end 167. After locking nub 13 advances past latch tab end 167, spring biased latch assembly 164 causes latch tab 166 to move back to its original position, thereby securing slide lock 12 within slide lock receptacle 118. To release slide lock from slide lock receptacle 118 a user may move latch tab 166 in the direction of arrow 168 thereby allowing slide lock 12 to be withdrawn from groove 160.

Figure 6:
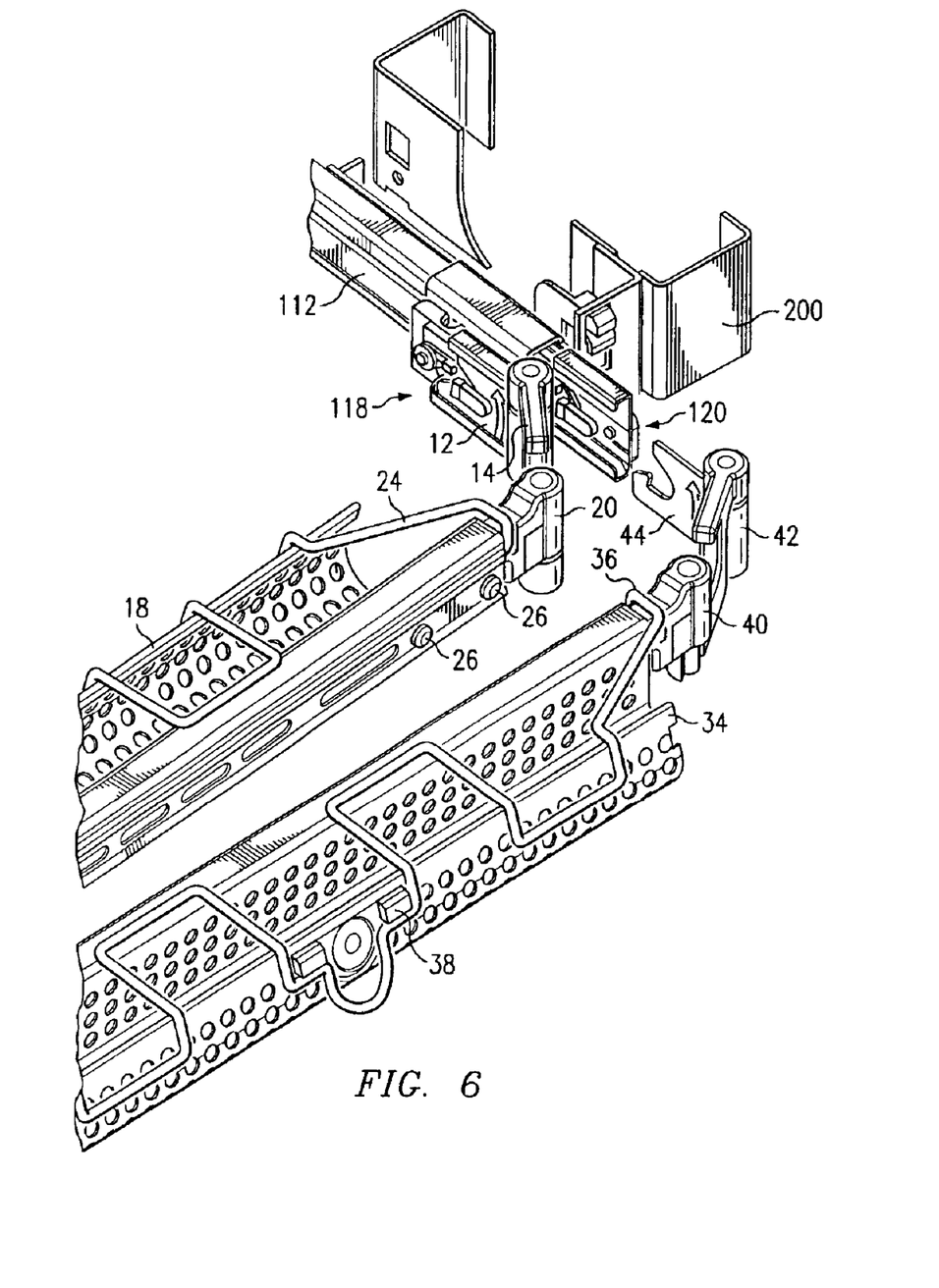
FIG. 6 shows an isometric view of a cable management assembly attached to a rack slide chassis member and rack slide stationary member of a rack slide assembly.

FIG. 6 shows a top view of the cable management assembly being installed in a rack 200, with portions broken away.

FIG. 7 shows a CMA stop 210 in relation to a slide assembly installed within a rack 200. Slide assembly 110 includes rack slide chassis member 112 slidably engaged with rack slide stationary member 110. In the present embodiment slide lock receptacle 118 is secured to rack slide chassis member 112 and slide lock receptacle 120 is secured to rack slide stationary member 110. CMA stop 210 is formed with an interface portion including a locking nub portion similar to the interface portion of first slide lock 12 and 44. In the present embodiment, CMA stop 210 is an independent component and is formed to engage with slide lock receptacle 120. Once engaged with slide lock receptacle 120, CMA stop 210 provides an interface to rest or secure tray hook 30 installed on cable management assembly 10 as shown in FIG. 1.

Among the other advantages of the present disclosure is that cable management assembly 10 is easy to install and requires no tools. The cable management assembly 10 also allows for ease of routing cables through basket trays 34 and 18, and allows for the easy addition or removal of cables during system upgrade or system service.

Cable management assembly 10 provides a significant reduction in visual clutter by incorporating visual features that are typically found in product front bezels and thus enhances the quality of the overall appearance of the product. Another significant improvement of the present disclosure is mounting the CMA independent of the information handling system component or the chassis. Accordingly, the CMA 10 does not require any specific interface on the information handling system component to which it is being installed.

Although the disclosed embodiments have been described in detail, it should be understood that various changes, substitutions and alterations can be made to the embodiments without departing from their spirit and scope.

What is claimed is:

1. A cable management assembly comprising:
   a first arm assembly pivotally coupled to a second and assembly;
   the first arm assembly including a first slide lock selectively coupled with a first slide lock receptacle operable to be disposed on a first rack slide chassis member;

the second arm assembly including a second slide lock coupled to a second slide lock receptacle operable to be disposed on a rack slide stationary member;

the first arm assembly pivotally connected to an end member;

the second arm assembly pivotally connected to the end member; and a wire tray hook connected to the end member and disposed between the first arm assembly and the second arm assembly, the wire tray hook operable to retain cabling channeled within the first arm assembly and the second arm assembly.

2. The cable management assembly of claim 1 further comprising the first arm assembly and the second arm assembly each having a basket tray and a movable cover formed to secure cabling disposed within the basket tray.

3. The cable management assembly of claim 1 further comprising the first slide lock operable to tool-lessly connect to the first slide lock receptacle and to tool-lessly disconnect from the first slide lock receptacle.

4. The cable management assembly of claim 1 further operable to be reversibly installed on a rack wherein:

the first slide lock operable to couple to a third slide lock receptacle disposed on a second rack slide stationary member and the second slide lock operable to couple to a fourth slide lock receptacle disposed on a second rack slide chassis member; and the second rack slide stationary member and the second rack slide chassis member operable to be disposed on an opposite side of the rack with respect to the first rack slide stationary member.

5. The cable management assembly of claim 1 further comprising:

a cable management assembly stop attached to a second rack slide chassis member, the second rack slide chassis member operable to be disposed within a rack opposite from the rack slide chassis member; and the wire tray hook formed to interact with the cable management assembly stop, the cable management assembly stop operable to selectively secure the cable management assembly with respect to the cable management assembly stop.

6. A cable management assembly comprising:

a first arm assembly pivotally coupled to a second arm assembly;

the first arm assembly and the second arm assembly each having a basket tray and a movable cover formed to secure cabling disposed within the basket tray;

the movable cover further comprising a wire frame cover able to rotate between an open position and a closed position;

wherein each arm assembly further comprises:
a slide lock operable to tool-lessly couple to a slide lock receptacle;
a pivot arm pivotally coupled to the slide lock;
a first hinge arm pivotally coupled to the pivot arm;
the basket tray coupled to the first hinge arm; and
a second hinge arm coupled to the basket tray and operable to pivotally couple to an end member.

7. The cable management assembly of claim 6 wherein:

each hinge arm having a groove formed therein to receive a portion of the movable cover and allow the movable cover to rotate between an open position and a closed position.

8. The cable management assembly of claim 6 wherein each movable cover comprises a wire frame cover.

9. The cable management assembly of claim 6 wherein each basket tray comprises a plurality of apertures formed therein operable to increase air flow through the basket tray.

10. The cable management assembly of claim 6 further comprising:

a wire tray hook connected to the end member and disposed between the first arm assembly and the second arm assembly, the wire tray hook operable to retain cabling channeled within the first arm assembly and the second arm assembly.

11. The cable management assembly of claim 10 further comprising:

a cable management assembly stop attached to a second rack slide chassis member, the second rack slide chassis member operable to be disposed within a rack opposite from a first rack slide chassis member; and the wire tray hook formed to interact with the cable management assembly stop, the cable management assembly stop formed to selectively secure the cable management assembly with respect to the cable management assembly stop.

12. The cable management assembly of claim 6 further comprising a latch formed on each basket tray operable to secure the movable cover in the closed position.

13. A rack system for housing information handling system components comprising:

a rack having a back, a front, and two sides;

a pair of rack slide stationary members secured on each side of the rack at a selected height;

a pair of rack slide chassis members, each rack slide chassis member slidably associated with a rack slide stationary member;

a component secured to the pair of rack slide chassis members, the component having cabling associated therewith;

a cable management assembly associated with the rack and the component, the cable management assembly comprising:
a first arm assembly pivotally connected with a second arm assembly; and
the first arm assembly and the second arm assembly each having a basket tray and a movable cover operable to secure the cabling therein.

14. The rack system of claim 13 wherein the rack comprises an EIA-310 compliant rack.

15. The rack system of claim 13 wherein the movable cover comprises a wire frame cover.

16. The rack system of claim 13 wherein each of the basket trays comprise a plurality of apertures operable to allow air flow therethrough.

17. The rack system of claim 13 wherein:

the first arm assembly comprises a first slide lock operable to couple to a first slide lock receptacle disposed on a first one of the rack slide chassis members; and the second arm assembly comprises a second slide lock operable to couple to a second slide lock receptacle disposed on a second one of the rack slide stationary members.

18. A cable management method comprising:

providing a cable management assembly having two pivotally connected arm assemblies, each arm assembly having a slide lock operable to couple with a slide lock receptacle;

attaching a first slide lock receptacle to a rack slide chassis member;

attaching a second slide lock receptacle to a rack slide stationary member;

coupling a first one of the slide locks with the first slide lock receptacle;

coupling a second one of the slide locks with the second slide lock receptacle providing each arm assembly having a basket tray and a movable cover;

positioning the movable cover in an open position;

disposing cabling within the basket tray of each arm assembly; and securing each movable cover in a closed position.

19. The method of claim 18 wherein each movable cover comprises a wire frame cover.

* * * * *